(12) United States Patent
Parameswaran et al.

(10) Patent No.: US 10,732,265 B1
(45) Date of Patent: Aug. 4, 2020

(54) OPTICAL ILLUMINATOR MODULE AND RELATED TECHNIQUES

(71) Applicant: Analog Devices, Inc., Norwood, MA (US)

(72) Inventors: Krishnan Ramaswamy Parameswaran, Billerica, MA (US); Xu Tang, Sudbury, MA (US); Ying-Ju Wang, Boulder, CA (US); Weidong Wang, Westford, MA (US); David Bolognia, Charlestown, MA (US); Scott Robert Davis, Denver, CO (US); Christophe Antoine, Lexington, MA (US); Brian Hall, North Andover, MA (US)

(73) Assignee: Analog Devices, Inc., Norwood, MA (US)

( * ) Notice: Subject to any disclaimer, the term of this patent is extended or adjusted under 35 U.S.C. 154(b) by 0 days.

(21) Appl. No.: 16/382,042

(22) Filed: Apr. 11, 2019

(51) Int. Cl.
*G01S 7/481* (2006.01)
*H01S 5/022* (2006.01)
(Continued)

(52) U.S. Cl.
CPC ........ *G01S 7/4814* (2013.01); *G02B 26/0833* (2013.01); *G02F 1/295* (2013.01);
(Continued)

(58) Field of Classification Search
CPC ...... G02F 1/295; G01S 7/4814; H01S 5/0071; G02B 26/08
See application file for complete search history.

(56) References Cited

U.S. PATENT DOCUMENTS

| 5,394,413 A | 2/1995 | Zayhowski |
| 5,396,511 A | 3/1995 | Nakatsuka et al. |

(Continued)

FOREIGN PATENT DOCUMENTS

| EP | 0639782 A1 | 2/1995 |
| JP | H08228044 A | 9/1996 |

(Continued)

OTHER PUBLICATIONS

Baker, Howard J, et al., "Self-imaging and high-beam-quality operation in multi-mode planar waveguide optical amplifiers", Optics Express, vol. 10, No. 6, (Mar. 25, 2002), 6 pgs.

(Continued)

*Primary Examiner* — Tuan N Nguyen
(74) *Attorney, Agent, or Firm* — Schwegman Lundberg & Woessner, P.A.

(57) ABSTRACT

An optical illuminator assembly such as an integrated module can provide an illumination source for use in applications such as optical detection. A peak output power of the module can be enhanced as compared to other approaches, such as by one or more of controlling parasitic effects along an electrical pathway used to drive an optical emitter circuit included as a portion of the module, or by providing thermal management including establishing thermal conduction pathways through opposite surfaces of an optical emitter circuit such as an integrated circuit die comprising a solid-state optical emitter. Control schemes can be used that power various cells or functional blocks of the optical emitter independently. Thermal regulation can be provided by an active heat transfer element such as a thermoelectric cooler (TEC). An optical illuminator assembly can be optically coupled to a beam-steering device or other elements, such as using a self-aligning mechanical configuration.

20 Claims, 4 Drawing Sheets

(51) Int. Cl.
  *G02F 1/295* (2006.01)
  *H01S 5/00* (2006.01)
  *H01S 5/024* (2006.01)
  *G02B 26/08* (2006.01)
  *H01S 3/23* (2006.01)

(52) U.S. Cl.
  CPC .......... *H01S 3/2308* (2013.01); *H01S 5/0071* (2013.01); *H01S 5/02248* (2013.01); *H01S 5/02415* (2013.01); *H01S 5/02476* (2013.01)

(56) References Cited

U.S. PATENT DOCUMENTS

| | | | |
|---|---|---|---|
| 5,812,570 | A | 9/1998 | Spaeth |
| 6,219,361 | B1 | 4/2001 | Guch, Jr. et al. |
| 6,720,581 | B2 | 4/2004 | Ozawa |
| 6,879,757 | B1 | 4/2005 | Zhou et al. |
| 6,894,828 | B2 | 5/2005 | Pelouch et al. |
| 7,193,771 | B1 | 3/2007 | Smith et al. |
| 7,305,016 | B2 | 12/2007 | Stephens, IV |
| 7,406,220 | B1 | 7/2008 | Christensen et al. |
| 7,676,915 | B2 | 3/2010 | Ter-Hovhannissian |
| 7,826,702 | B2 | 11/2010 | Dawes |
| 8,311,374 | B2 | 11/2012 | Hochberg et al. |
| 8,457,171 | B2 | 6/2013 | Peuser et al. |
| 8,483,249 | B1* | 7/2013 | Govorkov ........... H01S 5/02264 372/34 |
| 8,559,107 | B2 | 10/2013 | Huang et al. |
| 2001/0038140 | A1* | 11/2001 | Karker ................. H01L 23/057 257/666 |
| 2004/0075917 | A1 | 4/2004 | Sato et al. |
| 2005/0286581 | A1 | 12/2005 | Shinohara et al. |
| 2009/0104727 | A1* | 4/2009 | Krejci .................. H01S 5/4031 438/46 |
| 2010/0033976 | A1 | 2/2010 | Sun et al. |
| 2011/0305256 | A1 | 12/2011 | Chann et al. |
| 2016/0139266 | A1 | 5/2016 | Montoya et al. |
| 2018/0045882 | A1 | 2/2018 | Chojnacki et al. |
| 2019/0260179 | A1* | 8/2019 | Ueyama ............. H01S 5/02276 |

FOREIGN PATENT DOCUMENTS

| | | |
|---|---|---|
| JP | 2006032406 A | 2/2006 |
| JP | 2006032408 A | 2/2006 |
| WO | WO-2016097409 A2 | 6/2016 |

OTHER PUBLICATIONS

Davis, Scott R., et al., "A lightweight, rugged, solid state laser radar system enabled by nonmechanical electro-optic beam steerers", Proc. of SPIE vol. 9832, Laser Radar Technology and Applications XXI, (May 13, 2016), 12 pgs.

Doylend, J.K., et al., "Two-dimensional free-space beam steering with an optical phased array on silicon-on-insulator", Optics Express, vol. 19, No. 22, (Oct. 24, 2011), 10 pgs.

Heck, Martijn J.R., et al., "Highly integrated optical phased arrays: photonic integrated circuits for optical beam shaping and beam steering", Nanophotonics, vol. 6, Issue 1, (2016), 16 pgs.

Hulme, J.C., et al., "Fully integrated hybrid silicon free-space beam steering source with 32 channel phased array", Proc. of SPIE vol. 8989, Smart Photonic and Optoelectronic Integrarted Circuits XVI, (2014), 15 pgs.

Kwong, David Nien, "Towards Two Dimensional Optical Beam Steering with Silicon Nanomembrane-Based Optical Phased Arrays", U. of Texas at Austin Doctoral Dissertation, (Aug. 2013), 123 pgs.

Sarabalis, Christopher J., et al., "Optomechanical antennas for on-chip beam-steering", arXiv:1710.04197v1 [physics.optics], (Oct. 11, 2017), 16 pgs.

Smith, Braden, et al., "Single chip lidar with discrete beam steering by digital micromirror device", Optics Express, vol. 25, No. 13, (Jun. 26, 2017), 14 pgs.

Tows, Albert, et al., "A multi-wavelength LIDAR system based on an erbium-doped fiber MOPA-system", Proc. of SPIE 9246, Lidar Technologies, Techniques, and Measurements for Atmospheric Remote Sensing X, (Oct. 20, 2014).

Wu, Dihai, et al., "Thermal Behavior of Microchannel Cooled High Power Diode Laser Arrays", 17th International Conference on Electronic Packaging Technology, (2016), 7 pgs.

Yaacobi, Amy, "Integrated Optical Phased Arrays for Lidar Applications", MIT Doctoral Dissertation, (Jun. 2015), 120 pgs.

\* cited by examiner

OPTICAL ILLUMINATOR MODULE AND RELATED TECHNIQUES

FIELD OF THE DISCLOSURE

This document pertains generally, but not by way of limitation, to apparatus and techniques that can be used for generating a light beam, such as comprising coherent light (e.g., laser light) to provide illumination of objects for detection by an optical receiver.

BACKGROUND

An optical detection system, such as a system for providing light detection and ranging (LIDAR), generally includes a light source (e.g., an illuminator) and an optical receiver. Various schemes can be used to provide illumination of a field-of-regard, such as a flash technique in which a large portion or an entirety of the of the field-of-regard is illuminated contemporaneously. In another approach, scanning can be used to selectively illuminate portions of the field-of-regard. Such scanning can include use of one or more mechanical actuators such as rotating or oscillating mirrors or prism structures to orient a beam of light toward specified portions of the field-of-regard. In yet another approach, a non-mechanical beam-steering technique can be used, either alone or in combination with a mechanically-scanned technique. Optical detection systems such as LIDAR can be applied in vehicular applications, such as to facilitate operation of autonomous vehicles. Other applications can include beam guidance to facilitate communication or tracking of an object, for example.

SUMMARY OF THE DISCLOSURE

An optical detection system generally includes an optical transmitter and an optical receiver. The optical transmitter can include an illuminator module. For example, in a scanned transmit approach, the illuminator module can establish an output beam or "spot" that can be mechanically or electro-optically steered to various locations in a field-of-regard (FOR). The optical receiver can capture light that is scattered or reflected off one or more objects within the receiver field-of-view (FOV). An optical output power achievable by the illuminator module can affect system parameters such as optical detection range or optical detection resolution (e.g., a minimum resolvable angular resolution). As an illustrative example, in an autonomous transport application, an optical detection system may need to be able to detect an object having 10% reflectivity (e.g., detection of reflected light that provides a radiant flux that is 0.10 times the incident radiant flux) at a range of 200 meters from the optical detection system. Such an illustrative example can correspond to an application where optical detection is being performed by a vehicle traveling at highway speed. Generally, optical detection can be enhanced by one or more of increasing a peak output power of the optical transmitter or by enhancing a detection sensitivity of the optical receiver.

The present inventors have recognized, among other things, that a peak output power of an optical illuminator module can be enhanced as compared to other approaches, such as by one or more of controlling parasitic effects along an electrical pathway used to drive an optical emitter circuit and by providing thermal management including establishing thermal conduction pathways through opposite surfaces of an optical emitter circuit die. The present inventors have also recognized that for certain optical emitter circuit architectures, such as a Master Oscillator Power Amplifier (MOPA) architecture, respective blocks of the optical emitter circuit can be operated independently, such as intermittently. For example, a master oscillator portion of a MOPA laser architecture can be powered continuously while the power amplifier portion of the laser is operated intermittently. In another example, the master oscillator can be energized for specified durations that are longer than durations over which the power amplifier is energized. The present inventors have also recognized, among other things, that an optical illuminator assembly can be optically coupled to a beam-steering device or other system elements, such as using a self-aligning mechanical configuration.

In an example, an apparatus can include (or a technique such as a method can include use of) an electro-optical illuminator module, comprising an optical emitter circuit defining a first electrical interconnect on a first surface and respective second electrical interconnects on a second surface opposite the first surface, a sub-mount comprising at least one via structure, the sub-mount configured to mechanically support the optical emitter circuit at the second surface, at least one driver integrated circuit electrically coupled to the optical emitter circuit through the sub-mount, a conductive clip electrically and mechanically coupled to the first electrical interconnect of the optical emitter circuit, and a heat dissipator thermally coupled to the at least one driver integrated circuit and the optical emitter circuit. The optical emitter circuit can include a laser having a Master Oscillator Power Amplifier architecture. The heat dissipator can include a heat spreader and a thermo-electric cooler (TEC), the heat spreader located between the TEC and the sub-mount. The conductive clip can provide a thermal and electrical connection between the sub-mount and the optical emitter circuit.

In an example, apparatus described herein can be used to implement a technique, such as a method. For example, such a method can include generating optical illumination using an electro-optical illuminator module, the method comprising driving an optical emitter circuit using at least one driver integrated circuit electrically coupled to the optical emitter circuit through a sub-mount, the driving comprising conducting operating current between the optical emitter circuit and the at least one driver integrated circuit using a conductive clip, the conductive clip also conducting heat from the optical emitter circuit from a surface opposite the sub-mount, and dissipating heat from the optical emitter circuit through a heat dissipator, the heat dissipator thermally coupled to the at least one driver integrated circuit and the sub-mount.

Generally, the examples described in this document can be implemented in whole or in part within an integrated circuit package or module. An integrated circuit package or model can include an optical illuminator assembly comprising an optical emitter circuit, at least one driver integrated circuit, and a heat dissipator. Such an integrated module can include other circuitry, such as power supply or power conditioning circuitry, optical elements such as lens structures, and a beam-steerer. The beam-steerer can include an electro-mechanical beam-steerer such as a micro-electromechanical system (MEMS) device comprising an array of mirrors. In another example, the beam-steerer can include a liquid-crystal waveguide (LCW) beam-steering device, as described in other examples herein.

This summary is intended to provide an overview of subject matter of the present patent application. It is not intended to provide an exclusive or exhaustive explanation of the invention. The detailed description is included to provide further information about the present patent application.

BRIEF DESCRIPTION OF THE DRAWINGS

In the drawings, which are not necessarily drawn to scale, like numerals may describe similar components in different views. Like numerals having different letter suffixes may represent different instances of similar components. The drawings illustrate generally, by way of example, but not by way of limitation, various embodiments discussed in the present document.

DETAILED DESCRIPTION

An optical detection system can be used to detect objects such as obstacles. Such detection can include identifying one or more of a distance from the optical system, a spatial location of an object, or an extent of such an object. Various approaches can be used to perform such detection, including illuminating a field-of-regard using either a "flash" or scanned optical transmitter scheme, or combinations thereof. Light that is reflected or scattered by objects in the field-of-regard can be detected and then processed, such as converted to an electrical signal, amplified, filtered, and digitized for processing. Such processing can include use of a time-to-digital (TDC) estimation technique.

Apparatus and techniques described herein can be used to provide a compact illuminator assembly (e.g., an integrated module) comprising a light source, circuitry to drive the light source, optical structures, and thermal management features. Such a compact assembly can provide an optical transmitter for an optical detection system. For example, such an optical detection system can be used for performing light detection and ranging (LIDAR), such as for use in autonomous transportation applications. An optical illuminator as shown and described herein can include or can be optically coupled to a beam-steering element, such as an electromechanical or electro-optical beam-steerer (or combinations thereof). Such beam-steering can be used to support optical scanning of a field-of-regard, or other applications such as beam direction for communication or tracking of an object.

Figure 1A:
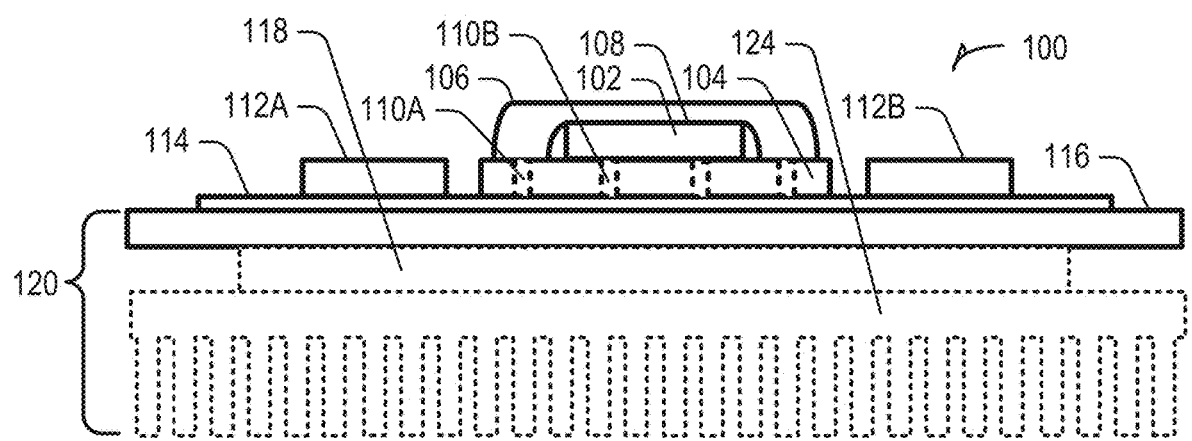
FIG. 1A illustrates generally an example comprising an electro-optical illuminator assembly, such as can be packaged in an integrated module package.
Figure 1B:
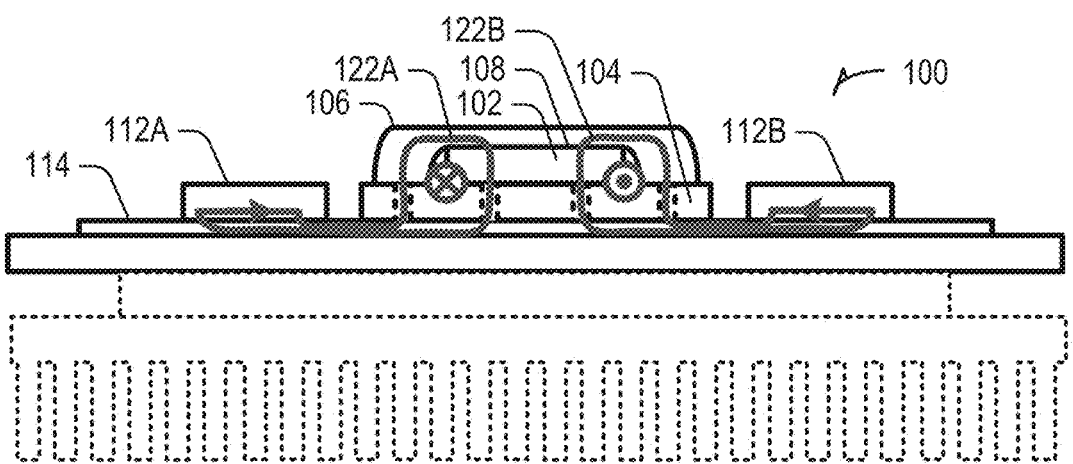
FIG. 1B illustrates generally an illustrative example comprising symmetrical current paths that can be established in operation of the electro-optical illuminator assembly of FIG. 1A.

FIG. 1A illustrates generally an example comprising an electro-optical illuminator assembly 100, such as can be packaged in an integrated module package, and FIG. 1B illustrates generally an illustrative example comprising symmetrical current paths that can be established in operation of the electro-optical illuminator assembly 100 of FIG. 1A. The electro-optical illuminator assembly 100 can include an optical emitter circuit 102 such as a light-emitting diode structure or other semiconductor light source. For example, the optical emitter circuit 102 can include a semiconductor laser die. Various examples of such optical emitter circuits 102 include a Master Oscillator Power Amplifier (MOPA) architecture, a Slab-Coupled Optical Waveguide Laser (SCOWL), or a Diode-Pumped Solid-State Laser (DPSSL). In an illustrative example, the electro-optical illuminator assembly 100 can produce light in a short-wave infrared (SWIR) wavelength band (e.g., from about 1400 nanometers to about 1600 nm). The optical emitter circuit can include an output facet such as to provide an end-firing configuration into or out of a plane defined by the page showing FIG. 1A and FIG. 1B.

The optical emitter circuit 102 can define a first electrical interconnect on a first surface supported by a sub-mount 104, and a second electrical interconnect on a second surface 108 opposite the first surface. The first and second electrical interconnects can include conductive pad structures or land structures such as to facilitate electrical and mechanical coupling to other portions of the electro-optical illuminator assembly 100. In the example of FIG. 1A and FIG. 1B, a conductive clip 106 can be electrically and mechanically coupled to the second surface 108 of the optical emitter circuit 102 die, such as provide a low-impedance path for drive signals and to conduct heat from the optical emitter circuit 102 die. The conductive clip can be electrically coupled to the optical emitter circuit 102 die using one or more of a conductive adhesive (e.g., a conductive epoxy), a weld, or using a spring force provided at least in part by the conductive clip 106, as illustrative examples. The conductive clip 106 can be fabricated from a material such as copper, aluminum, or graphite, as illustrative examples.

Heat can be conducted away from the optical emitter circuit 102 through the sub-mount 104, and the conductive clip 106 can also conduct heat away from the optical emitter circuit 102, such as through the sub-mount 104 where the conductive clip 106 terminates. Signals to drive the optical emitter circuit 102 can be provided at least one driver circuit. For example, as shown in FIG. 1A and FIG. 1B, a first driver circuit 112A can be located nearby the sub-mount 104 laterally offset from the optical emitter circuit 102, such as electrically coupled to the optical emitter circuit 102 through the sub-mount 104. For example, the sub-mount 104 can include one or more conductive via structures 110A or 110B to route a drive signal to the optical emitter circuit 102 and to provide a return path for such a drive signal. A second driver circuit 112B can be located laterally, such as symmetrically opposite the first driver circuit 112A. Use of a symmetric configuration can provide enhanced power handling capability and can also enhance heat dissipation efficiency, as compared to using a single drive approach or using asymmetrically-located drivers.

A laminate structure 114, such as a printed wiring board or interposer, can provide electrical interconnections between the first and second driver circuits 112A and 112B and the sub-mount 104. The laminate structure 114 can include one or more material layers such as a glass-epoxy laminate, an epoxy, a bismaleimide triazine (BT) material, or combinations thereof, as illustrative examples. Alternatively, or in addition, one or more wire bonds (or ribbons) could be provided between the first and second driver circuits 112A and 112B, and other portions of the electro-optical illuminator assembly 100, but such wire-bonds (or ribbons) are not required for high-current pathways used to drive the optical emitter circuit 102. As an illustrative example, the first and second driver circuits 112A and 112B can include flip-chip configurations such as comprising respective integrated circuit dice placed face-down with electrical interconnections (e.g., pads, lands, or pillars) or other conductive structures to couple drive circuitry located on-board the first and second driver circuit 112A and 112B directly to the laminate structure 114 without requiring a separate integrated circuit package for the first and second driver circuits 112A and 112B.

Heat can be conducted away from the optical emitter circuit 102 using the copper clip 106 and the sub-mount 104, and can be dissipated, such as using a heat dissipator 120 comprising one or more elements. Generally, the sub-mount 104 can include a material having a coefficient of thermal expansion (CTE) that is substantially similar to a CTE of a bulk of the optical emitter circuit 102 (e.g., sufficient to suppress or inhibit fracture or stressing of a die comprising the optical emitter circuit 102). The sub-mount can include aluminum nitride (AlN) as an illustrative example. The heat dissipator can include a slab heat spreader structure 116, such as comprising an electrically insulating material. An example of such a material is SIL-PAD, available from Henkel Adhesives (Henkel AG & Co. KGaA, Germany).

A heat sink 124 can be thermally and mechanically coupled to the heat spreader structure 116. For example, the heat sink 124 can include aluminum, such as anodized or otherwise passivated aluminum. An active element such as a thermoelectric cooler (TEC) 118 can be used, such as to create or enhance a heat flux from the heat spreader 116 to the heat sink 124. In an illustrative example, the TEC 118 can be used to regulate the temperature of the electro-optical illuminator assembly 100 (or a least a portion thereof). Such regulation can be used to constrain or regulate a temperature of the assembly to within a specified range of temperatures. In another approach, such regulation can be performed to maintain an output wavelength of the optical emitter circuit 102 within a specified range of wavelengths. In an example, the laminate structure 114 can provide one or more electrical interconnections to supply an operating voltage to the TEC 118. In an example, the TEC 118 can be extended and can provide thermal management to other portions of a system including the electro-optical illuminator assembly 100. For example, in FIG. 3A and FIG. 3B, an electro-optical illuminator assembly 300 is optically coupled with a waveguide. The TEC 118 (or a separate TEC) can be used to provide thermal management (such as temperature regulation) of the waveguide structure.

Generally, the present inventors have recognized that a challenge can exist in driving relatively high currents (e.g., having a magnitude of 10s to 100s of amperes, such as 400 A peak magnitude) with high slew rates (e.g., corresponding to pulse widths on the order of 1s or 10 s of nanoseconds). Parasitic effects can reduce or inhibit current flow, such as due to loop area and conductor geometry contributing to parasitic inductance of a current path used to drive the optical emitter circuit 102. To address such a challenge, the present inventors have recognized, among other things, that an interconnect scheme and component arrangement can be used to reduce a loop area formed by a drive current path, as compared to other approaches. In an illustrative example, the optical emitter circuit 102 can include a master oscillator power amplifier (MOPA) architecture. A current pulse can be used to drive the power amplifier cell of the MOPA architecture, such as shown and described below in relation to FIG. 2.

Referring to FIG. 1A and FIG. 1B, such a current pulse can follow a path 122A from the first driver circuit 112A to the optical emitter circuit 102, through the sub-mount 104, and through the conductive clip 106. For example, the optical emitter circuit 102 can include a cathode terminal on the second surface 108 and one or more anode terminals on the first surface facing the sub-mount 104. In an example, a line or grid of via structures can be used to provide a distributed pathway for current flowing through the sub-mount 104 to supply the one or more anode terminals. To further reduce parasitic effects, such as associated with inductance established by the path 122A, a mirror-image path can be established using the symmetrically-located second driver circuit 112B, which can provide corresponding second current path 122B. When the first and second driver circuits 112A and 112B are energized to drive the optical emitter circuit 102 contemporaneously, transient magnetic field contributions from the first and second current paths 122A and 122B can cancel each other, as shown by the vectors into and out of the plane of the page showing FIG. 1B. In this manner, the conductive clip 106 can provide enhanced current-handling performance (in terms of slew rate and current magnitude) by controlling current-path 122A and 122B loop area, while also enhancing thermal performance to provide another heat-transfer pathway from the optical emitter circuit 102.

Figure 2:
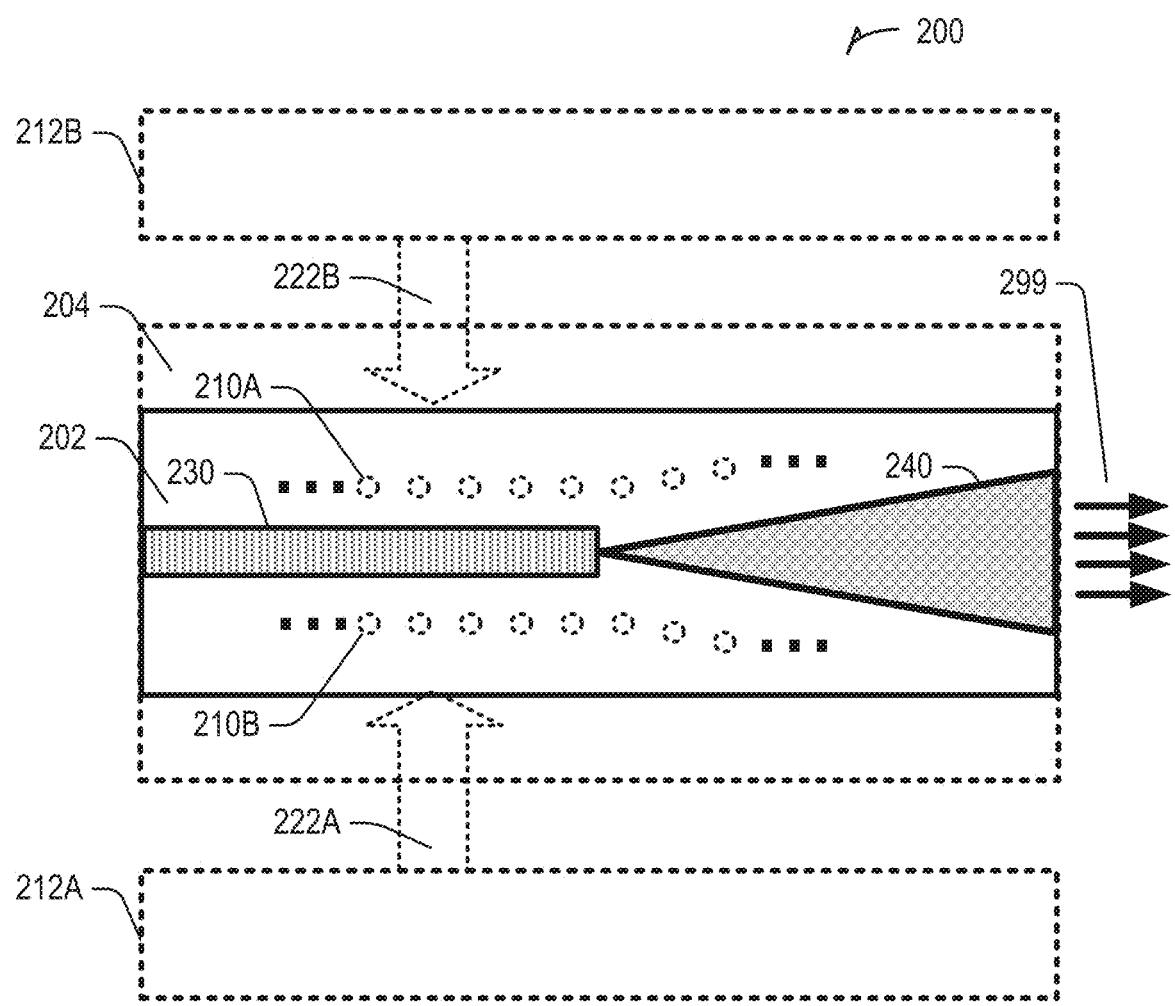
FIG. 2 illustrates generally an example comprising an optical emitter circuit comprising a Master Oscillator Power Amplifier (MOPA) architecture.

FIG. 2 illustrates generally an example 200 comprising an optical emitter circuit 202 comprising a Master Oscillator Power Amplifier (MOPA) architecture. As in the examples of FIG. 1A and FIG. 1B, the optical emitter circuit 202 can include a semiconductor laser die, such as having two portions or cells defining a master oscillator 230 portion and a power amplifier 240 portion, electrically and mechanically coupled to a sub-mount 204. The optical emitter circuit 202 can be electrically driven by symmetrically-located driver circuits, comprising a first driver circuit 212A and a second driver circuit 212B. The present inventors have recognized, among other things, that the master oscillator 230 can be driven independently of the power amplifier 240, such as by using independent channels or circuits included as a portion of the first driver circuit 212A and the second driver circuit 212B. Generally, a frequency (or wavelength) of the optical emitter circuit 202 is established by a magnitude of a current used to drive the master oscillator 230, and an optical output power (corresponding to a radiant flux from the optical emitter) is established by a magnitude of a current used to drive the power amplifier 240. For example, the present inventors have recognized that a higher peak optical output power can be achieved by duty cycling one or both of the power amplifier 240 and master oscillator 230, while reducing heat generation, as compared to other approaches. In an example, the master oscillator 230 can be operated intermittently for respective durations that are sufficient to establish a stable operating current, and the power amplifier 240 can be pulsed for shorter durations to generate optical radiation (indicated by the arrows 299) from a facet at the edge of the optical emitter circuit 202, such as to provide an illumination source for a scanning optical transmitter. Such an approach contrasts with other approaches where the optical emitter circuit 202 is operated continuously (e.g., a "continuous wave" (CW) operational mode).

As an illustrative example, the power amplifier 240 can be driven for a duration that ranges from a few nanoseconds up to a range of tens of nanoseconds. By comparison to CW operation, a heat dissipation is significantly reduced at least in part due to the comparably lower duty cycle (e.g., with such operation defined by a pulse repetition rate and a pulse width). To further reduce the power consumption and to improve thermal management, the master oscillator 230 (e.g., a distributed feedback amplifier) can also be operated in a pulsed mode. Turning on and off the current supplied to the master oscillator 230 has a potential impact on the optical emitter circuit 202 frequency, such as due to both current and temperature variation when operated in the pulsed mode. An experimentally-observed frequency chirp during a pulse duration of less than 100 ns (e.g., suitable for LIDAR illumination) was generally no more than 0.01 nm, once the laser current was stabilized, for a MOPA laser operated at 1550 nm with a distributed feedback laser (DFB) as a master oscillator. Accordingly, such frequency variation can be considered negligible for applications such as LIDAR, and has little impact on waveguide coupling or steering.

As discussed above in relation to FIG. 1A and FIG. 1B, the sub-mount 204 can include via structures, such as a first via 110A and a second via 110B. The via structures can be aligned in a row or grid configuration, such as to provide symmetric source or return paths for drive signals 222A and 222B. In the examples of FIG. 1A, FIG. 1B, and FIG. 2, two driver circuits are shown. Other counts of driver circuits can be used (such as three or four driver circuits, as illustrative examples). The examples of FIG. 1A, FIG. 1B, and FIG. 2 show bilateral symmetry. Other arrangements of driver circuits can be used, such as having higher degrees of symmetry or following a "hub-and-spoke" topology, for example. In an illustrative example, a length of the optical emitter circuit 202 in the long axis can be about 4 to about 6 millimeters (mm), such as about 5 mm. The via structures can be about 0.15 mm in diameter, such as having an 0.5 mm pitch between centers.

Figure 3A:
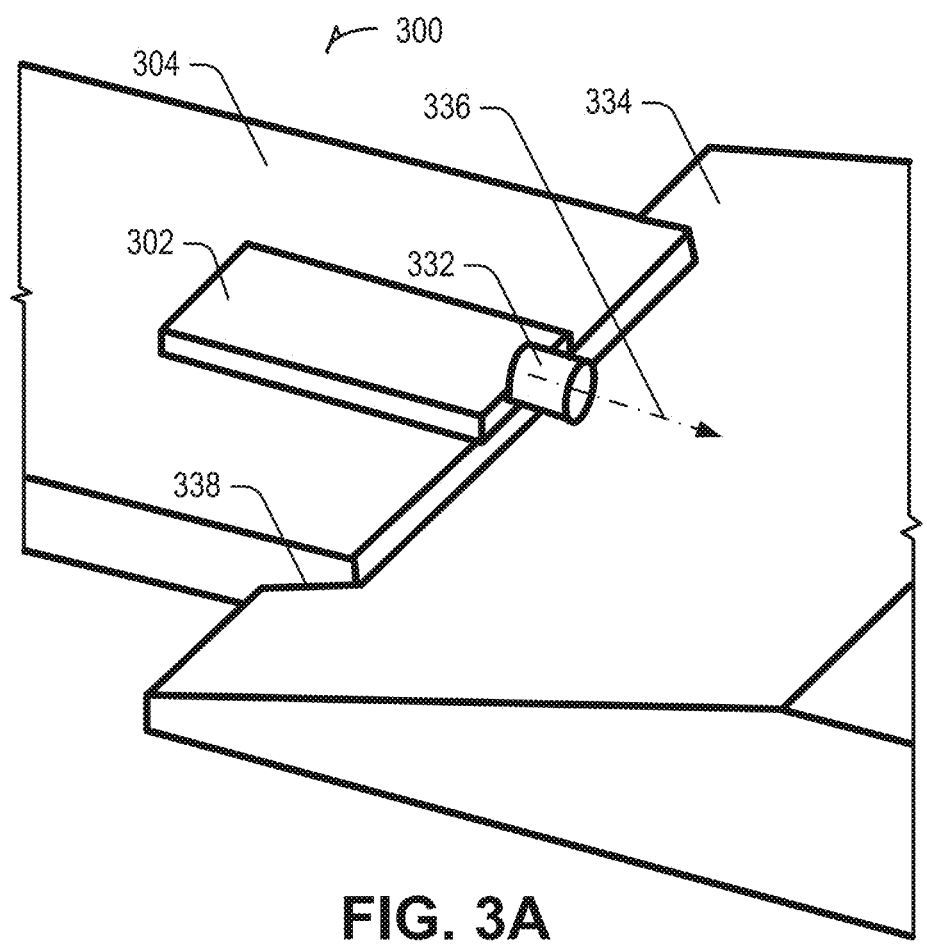
FIG. 3A illustrates generally a first view of an example comprising an optical emitter circuit coupled to a waveguide structure using a self-aligning mechanical feature.
Figure 3B:
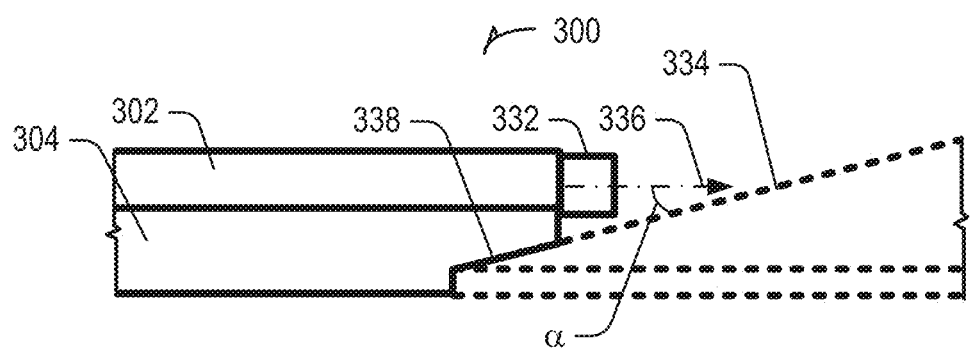
FIG. 3B illustrates generally a second view of an example comprising an optical emitter circuit coupled to a waveguide structure using a self-aligning mechanical feature.

FIG. 3A illustrates generally a first view of an example 300 comprising an optical emitter circuit 302 coupled to a waveguide structure 334 using a self-aligning mechanical feature 338 and FIG. 3B illustrates generally a second view of the example 300. The electro-optical illuminator assembly can include the optical emitter circuit 302, and a substrate such as a sub-mount 304 or another substrate. The optical emitter circuit 302 can be optically coupled to an electro-mechanical beam-steerer or an electro-optical beam-steerer. In an illustrative example, an electro-mechanical beam-steerer can include MEMS-based device such as MEMS mirror array. In another example, the beam-steerer can include an electro-optical device.

For example, the beam-steerer can include a liquid-crystal waveguide beam-steerer such as a Scannable Electro-Evanescent Optical Refractor (SEEOR), such as included as a portion of the waveguide structure 334. Generally, an optical output provided by the optical emitter circuit 302 can define a beam shape that may differ from a desired beam profile or spatial mode. Accordingly, one or more output optics such as an output optic 332 can be located between the optical emitter circuit 302 and the waveguide structure 334, such as optically coupled to an output facet of the optical emitter circuit 302. In this manner, the optical output of the optical emitter circuit 302 can adjusted to establish or match a desire spatial mode suitable for the waveguide structure 334. In the examples of FIG. 3A and FIG. 3B, an angled feature is defied by an input facet of the waveguide structure 334 and a portion of the sub-mount 304. Other configurations are possible, such as other shapes (e.g., a triangular or stair-stepped profile). Generally, use of such a feature allows a mechanically self-aligning configuration so that an angle, "α," between an input facet of the waveguide structure 334 and a beam 336 formed by the optical emitter circuit 302 and output optic 332 is controlled. In another example, the waveguide structure 334 need not have angled facet and light from the optical emitter circuit can be in-coupled using other techniques such as a grating structure. In yet another example, one or more of the optical emitter circuit 302 or the sub-mount 304 can be mechanically and electrically coupled to an end facet, a top surface, or a bottom surface of the waveguide structure 334.

Use of a beam-steerer can facilitate steering or scanning of the beam 336 in one or two dimensions, such as to facilitate scanning of the beam. For example, the beam can be scanned according to a raster pattern or other arbitrary pattern according to beam-steering control signals provided to the beam-steerer. In the illustrative example of an LCW structure used for beam-steering, lensing can be performed to shape the beam 336 in two axes to correct for astigmatism associated with the LCW structure. A half waveplate can be used, such as to adjust a polarization of light from the optical emitter circuit 302 to avoid a polarization that is orthogonal to a desired input polarization for the waveguide structure 334. The waveguide structure 334, ant the optical emitter circuit 302 (and its substrate) can be co-integrated in an electro-optical module package.

Illustrative (but non-limiting) examples of waveguide structures (e.g., LCW structures similar to those discussed above in relation to FIG. 3A or FIG. 3B, or other examples herein) can be found in (1) U.S. Pat. No. 10,133,083; (2) U.S. Pat. No. 10,120,261; (3) U.S. Pat. Nos. 9,366,938, 9,885,892, 9,829,766, and 9,880,443; (4) U.S. Pat. Nos. 8,311,372 and 8,380,025; (5) U.S. Pat. No. 8,860,897; (6) U.S. Pat. No. 8,463,080; and (7) U.S. Pat. No. 7,570,320, all of which are incorporated herein by reference in their entireties, including for their description of LCWs and uses such as for beam-steering of light, including in-plane and out-of-plane beam-steering.

Figure 4:
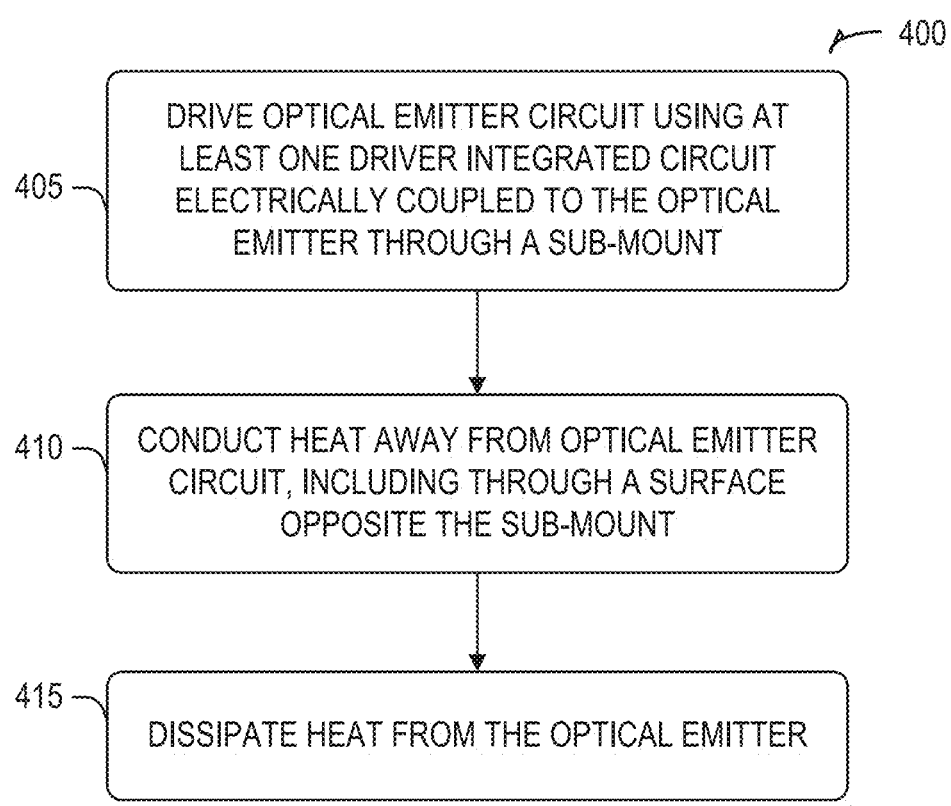
FIG. 4 illustrates generally a technique, such as a method, comprising driving an optical emitter circuit and conducting heat away from the optical emitter circuit.

FIG. 4 illustrates generally a technique 400, such as a method, comprising driving an optical emitter circuit and conducting heat away from the optical emitter circuit. The technique of FIG. 4 can be performed using various optical emitter configurations such as shown and described in relation to other examples herein (e.g., using a configuration as shown illustratively in FIG. 1A, FIG. 1B, FIG. 2, FIG. 3A, or FIG. 3B). At 405, the technique 400 can include driving an optical emitter circuit (e.g., a laser device having a MOPA architecture, or another solid-state optical emitter), using at least one driver integrated circuit electrically coupled to the optical emitter through a sub-mount. As shown and described in relation to other examples herein, a symmetric configuration defined by two or more driver circuits can be used. As an illustrative example, the driving the optical emitter circuit can include conducting operating current between the optical emitter circuit and the at least one driver integrated circuit using a conductive clip. At 410, the technique 400 can include conducting heat away from the optical emitter circuit, including through a surface opposite the sub-mount. For example, the conductive clip mentioned above can be used to conduct heat from the optical emitter circuit. At 415, heat can be dissipated such as using a heat dissipator thermally coupled to the at least one drive circuit and the sub-mount. For example, as shown and described in relation to other examples herein, such heat dissipation can include use of one or more of a heat spreader, a heat sink, or an active device such as a thermoelectric cooler. Optionally, the technique 400 can include use of a MOPA architecture, where a master oscillator portion of the optical emitter circuit is driven (e.g., supplied with operating energy) in a manner separate from providing energy to a power amplifier portion of the optical emitter circuit, as described in various examples in this document.

Each of the non-limiting aspects in this document can stand on its own, or can be combined in various permutations or combinations with one or more of the other aspects or other subject matter described in this document.

The above detailed description includes references to the accompanying drawings, which form a part of the detailed description. The drawings show, by way of illustration, specific embodiments in which the invention can be practiced. These embodiments are also referred to generally as "examples." Such examples can include elements in addition to those shown or described. However, the present inventors also contemplate examples in which only those elements shown or described are provided. Moreover, the present inventors also contemplate examples using any combination or permutation of those elements shown or described (or one or more aspects thereof), either with respect to a particular example (or one or more aspects thereof), or with respect to other examples (or one or more aspects thereof) shown or described herein.

In the event of inconsistent usages between this document and any documents so incorporated by reference, the usage in this document controls.

In this document, the terms "a" or "an" are used, as is common in patent documents, to include one or more than one, independent of any other instances or usages of "at least one" or "one or more." In this document, the term "or" is used to refer to a nonexclusive or, such that "A or B" includes "A but not B," "B but not A," and "A and B," unless otherwise indicated. In this document, the terms "including" and "in which" are used as the plain-English equivalents of the respective terms "comprising" and "wherein." Also, in the following claims, the terms "including" and "comprising" are open-ended, that is, a system, device, article, composition, formulation, or process that includes elements in addition to those listed after such a term in a claim are still deemed to fall within the scope of that claim. Moreover, in the following claims, the terms "first," "second," and "third," etc. are used merely as labels, and are not intended to impose numerical requirements on their objects.

Method examples described herein can be machine or computer-implemented at least in part. Some examples can include a computer-readable medium or machine-readable medium encoded with instructions operable to configure an electronic device to perform methods as described in the above examples. An implementation of such methods can include code, such as microcode, assembly language code, a higher-level language code, or the like. Such code can include computer readable instructions for performing various methods. The code may form portions of computer program products. Further, in an example, the code can be tangibly stored on one or more volatile, non-transitory, or non-volatile tangible computer-readable media, such as during execution or at other times. Examples of these tangible computer-readable media can include, but are not limited to, hard disks, removable magnetic disks, removable optical disks (e.g., compact disks and digital video disks), magnetic cassettes, memory cards or sticks, random access memories (RAMs), read only memories (ROMs), and the like.

The above description is intended to be illustrative, and not restrictive. For example, the above-described examples (or one or more aspects thereof) may be used in combination with each other. Other embodiments can be used, such as by one of ordinary skill in the art upon reviewing the above description. The Abstract is provided to allow the reader to quickly ascertain the nature of the technical disclosure. It is submitted with the understanding that it will not be used to interpret or limit the scope or meaning of the claims. Also, in the above Detailed Description, various features may be grouped together to streamline the disclosure. This should not be interpreted as intending that an unclaimed disclosed feature is essential to any claim. Rather, inventive subject matter may lie in less than all features of a particular disclosed embodiment. Thus, the following claims are hereby incorporated into the Detailed Description as examples or embodiments, with each claim standing on its own as a separate embodiment, and it is contemplated that such embodiments can be combined with each other in various combinations or permutations. The scope of the invention should be determined with reference to the appended claims, along with the full scope of equivalents to which such claims are entitled.

The claimed invention is:

1. An electro-optical illuminator module, comprising:
   an optical emitter circuit defining a first electrical interconnect on a first surface and respective second electrical interconnects on a second surface opposite the first surface;
   a sub-mount comprising at least one via structure, the sub-mount configured to mechanically support the optical emitter circuit at the second surface;
   at least first and second driver integrated circuits electrically coupled to the optical emitter circuit through the sub-mount, the first and second driver integrated circuits located symmetrically with respect to the optical emitter circuit to control an inductance associated with a a first electrical loop formed by a first electrical path between the first driver integrated circuit and the optical emitter, and a second electrical loop formed by a second electrical path between the second driver integrated circuit and the optical emitter, respectively, to at least one of enhance power handling capability or heat dissipation, as compared to a non-symmetric driver configuration;
   a conductive clip electrically and mechanically coupled to the first electrical interconnect of the optical emitter circuit; and
   a heat dissipator thermally coupled to the first and second driver integrated circuits and the optical emitter circuit.

2. The electro-optical illuminator module of claim 1, wherein the optical emitter circuit comprises a laser having a Master Oscillator Power Amplifier architecture.

3. The electro-optical illuminator module of claim 2, wherein the first and second driver integrated circuits are configured to provide operating energy to a master oscillator portion of the optical emitter circuit in a manner separate from providing operating energy to a power amplifier portion of the optical emitter circuit.

4. The electro-optical illuminator module of claim 1, wherein the optical emitter circuit comprises an edge-emitting semiconductor laser.

5. The electro-optical illuminator module of claim 4, wherein heat dissipator comprises a heat spreader and a thermo-electric cooler (TEC), the heat spreader located between the TEC and the sub-mount.

6. The electro-optical illuminator module of claim 1, where the conductive clip provides a thermal and electrical connection between the sub-mount and the optical emitter circuit.

7. The electro-optical illuminator module of claim 1, wherein the sub-mount comprises a material having a coefficient of thermal expansion (CTE) that is substantially similar to a CTE of a bulk of the optical emitter circuit.

8. The electro-optical illuminator module of claim 1, comprising a laminate structure located between the heat dissipator and the sub-mount; and
wherein the first and second driver integrated circuits are located on the laminate structure, the laminate structure electrically coupling the at least first and second driver integrated circuits with the optical emitter circuit through the sub-mount.

9. The electro-optical illuminator module of claim 1, wherein the optical emitter circuit comprises an output facet defined by a surface other than the first and second surfaces.

10. The electro-optical illuminator module of claim 1, comprising an output optic, optically coupled to an output facet of the optical emitter circuit.

11. The electro-optical illuminator module of claim 10, comprising a MEMS beam-steerer, optically coupled to the output facet of the optical emitter circuit.

12. The electro-optical illuminator module of claim 10, comprising a waveguide structure including a feature to self-align the waveguide structure with the output optic to couple optical energy from the optical emitter into the waveguide structure.

13. The electro-optical illuminator module of claim 12, wherein the waveguide structure comprises an electro-optical beam-steerer.

14. A method for generating optical illumination using an electro-optical illuminator module, the method comprising:
driving an optical emitter circuit using at least first and second driver integrated circuits electrically coupled to the optical emitter circuit through a sub-mount, the first and second driver integrated circuits located symmetrically with respect to the optical emitter circuit to control an inductance associated with a first electrical loop formed by a first electrical path between the first driver integrated circuit and the optical emitter, and a second electrical loop formed by a second electrical path between the second driver integrated circuit and the optical emitter, respectively, to at least one of enhance power handling capability or heat dissipation, as compared to a non-symmetric driver configuration, and the driving comprising conducting operating current between the optical emitter circuit and the first and second driver integrated circuits using a conductive clip, the conductive clip also conducting heat from the optical emitter circuit from a surface opposite the sub-mount; and
dissipating heat from the optical emitter circuit through a heat dissipator, the heat dissipator thermally coupled to the first and second driver integrated circuits and the sub-mount.

15. The method of claim 14, wherein the optical emitter circuit comprises a laser having a Master Oscillator Power Amplifier architecture; and
wherein driving the optical emitter circuit comprises providing operating energy to a master oscillator portion of the optical emitter circuit in a manner separate from providing operating energy to a power amplifier portion of the optical emitter circuit.

16. The method of claim 15, wherein the master oscillator portion is powered continuously and the power amplifier portion is powered intermittently.

17. The method of claim 15, wherein the master oscillator portion is powered in a manner having an on-duration or duty cycle that is greater than a corresponding on-duration or duty cycle of the power amplifier portion.

18. An electro-optical illuminator module, comprising:
a means for electrically driving an optical emitter circuit at least in part using a sub-mount supporting the optical emitter circuit, the means for electrically driving the optical emitter circuit including first and second drive integrated circuits located symmetrically with respect to the optical emitter circuit to control an inductance associated with a first electrical loop formed by a first electrical path between the first driver integrated circuit and the optical emitter, and a second electrical loop formed by a second electrical path between the second driver integrated circuit and the optical emitter, respectively, to at least one of enhance power handling capability or heat dissipation, as compared to a non-symmetric driver configuration;
a means for conducting operating current between the optical emitter circuit and the means for electrically driving the optical emitter circuit, and also conducting heat from the optical emitter circuit from a surface opposite the sub-mount; and
a means for actively dissipating heat from the optical emitter circuit.

19. The electro-optical illuminator module of claim 18, wherein the optical emitter circuit comprises a laser having a Master Oscillator Power Amplifier architecture; and
wherein the means for driving the optical emitter circuit comprises a means for providing operating energy to a master oscillator portion of the optical emitter circuit in a manner separate from providing operating energy to a power amplifier portion of the optical emitter circuit.

20. The electro-optical illuminator module of claim 19, wherein the means for electrically driving the optical emitter circuit comprising a means for driving the master oscillator portion in a manner having an on-duration or duty cycle that is greater than a corresponding on-duration or duty cycle of a means for driving the power amplifier portion.

* * * * *